(12) United States Patent
Takeoka

(10) Patent No.: US 6,427,218 B2
(45) Date of Patent: Jul. 30, 2002

(54) METHOD OF GENERATING TEST PATTERN FOR SEMICONDUCTOR INTEGRATED CIRCUIT AND METHOD OF TESTING THE SAME

(75) Inventor: Sadami Takeoka, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/725,264

(22) Filed: Nov. 29, 2000

(30) Foreign Application Priority Data

Nov. 29, 1999 (JP) .......................... 11-337071

(51) Int. Cl.[7] .............................. G06F 11/00
(52) U.S. Cl. ................ 714/738; 714/728; 714/739
(58) Field of Search ........................ 714/736, 733, 714/738, 740, 744, 745, 739, 728; 327/199; 702/124

(56) References Cited

U.S. PATENT DOCUMENTS

| | | | | |
|---|---|---|---|---|
| 5,056,094 A | * | 10/1991 | Whetsel | 714/736 |
| 5,329,167 A | * | 7/1994 | Farwell | 327/199 |
| 5,600,787 A | | 2/1997 | Underwood et al. | 714/30 |
| 5,748,646 A | * | 5/1998 | Hosokawa | 714/726 |
| 5,812,561 A | * | 9/1998 | Giles et al. | 714/726 |
| 5,898,702 A | * | 4/1999 | Narayanan et al. | 714/726 |
| 5,923,676 A | * | 7/1999 | Sunter et al. | 714/733 |
| 6,148,425 A | * | 11/2000 | Bhawmik et al. | 714/726 |
| 6,163,760 A | * | 12/2000 | Koseko | 702/124 |

FOREIGN PATENT DOCUMENTS

JP       9-269959       10/1997

* cited by examiner

*Primary Examiner*—David Ton
(74) *Attorney, Agent, or Firm*—McDermott, Will & Emery (57) ABSTRACT

A method of generating a test pattern for a semiconductor integrated circuit including a logic circuit containing a combinational logic element, a first sequential circuit having an output side connected to an input side of the logic circuit, and a second sequential circuit having an input side connected to an output side of the logic circuit, whereby a test pattern for testing a signal path between the first and second sequential circuits for a data retention error associated with data held by the second sequential circuit based on output data of the second sequential circuit is generated. To generate the test pattern, a first test pattern is generated by setting, at the first sequential circuit, a first set value for the signal path such that the signal path is activated immediately before and after one pulse of a clock signal for synchronization is inputted and a second test pattern is generated by setting, at the first sequential circuit, a second set value obtained by inverting the first set value.

3 Claims, 8 Drawing Sheets

METHOD OF GENERATING TEST PATTERN FOR SEMICONDUCTOR INTEGRATED CIRCUIT AND METHOD OF TESTING THE SAME

BACKGROUND OF THE INVENTION

The present invention relates to a method of generating a test pattern for a semiconductor integrated circuit with which the semiconductor integrated circuit is tested by using a scanning method for a delay anomaly occurring during the manufacturing thereof and to a method of testing the semiconductor integrated circuit by using the generated test pattern.

With the rapid advancement of a miniaturizing technique used in a semiconductor process in recent years, semiconductor integrated circuits have been increased sharply in scale and function, which makes it more difficult to test the semiconductor integrated circuits. As a solution to the problem, a scanning method and the like have been used widely as techniques for facilitating the testing of the semiconductor integrated circuits so that a fault represented by a stuck fault model is tested efficiently. In the case of detecting a fault assumed to be the stuck fault model, a fault detecting ability is not dependent on the frequency of a clock signal for synchronization so that a scan test is normally conducted by using a clock frequency lower than the actual operating speed.

However, process variations have become more distinct as smaller geometries have been defined in the semiconductor process, so that sufficient testing quality is not guaranteed by merely conducting a test in accordance with a conventional scanning method using a low clock frequency. As a replacement, a test considering a signal delay on a signal path, such as a path delay test using the same clock frequency as used during actual operation has been in greater demand. For example, Japanese Unexamined Patent Publication No. HEI 9-269959 discloses a technique used in a conventional path delay test.

The conventional path delay test has been performed by assuming a fault model in which a delay value on a signal path is increased by a defect produced in the manufacturing process, i.e., a fault model in which a signal which should normally reach a terminal point of the signal path in one clock period is prevented by the defect from reaching the terminal point in one clock period.

However, the conventional path delay test has not been performed by assuming a fault model in which the delay value is reduced excessively against expectations by the defect produced in the manufacturing process (hereinafter referred to as an excessively reduced delay).

In a synchronous semiconductor integrated circuit, the following two phenomena can be listed as factors which distinguish the defect produced in the manufacturing process as the excessively reduced delay.

(1) Propagation of a signal along a signal path between flip-flops which is faster than a design value.

(2) Variations in the skew value of a clock supplied to each of the flip-flops via different clock lines.

If such phenomena occur, the signal path between the flip-flops undergoes a mis-operation termed a hold error (data retention error).

The two factors will be described herein below with reference to the drawings.

Figure 7:
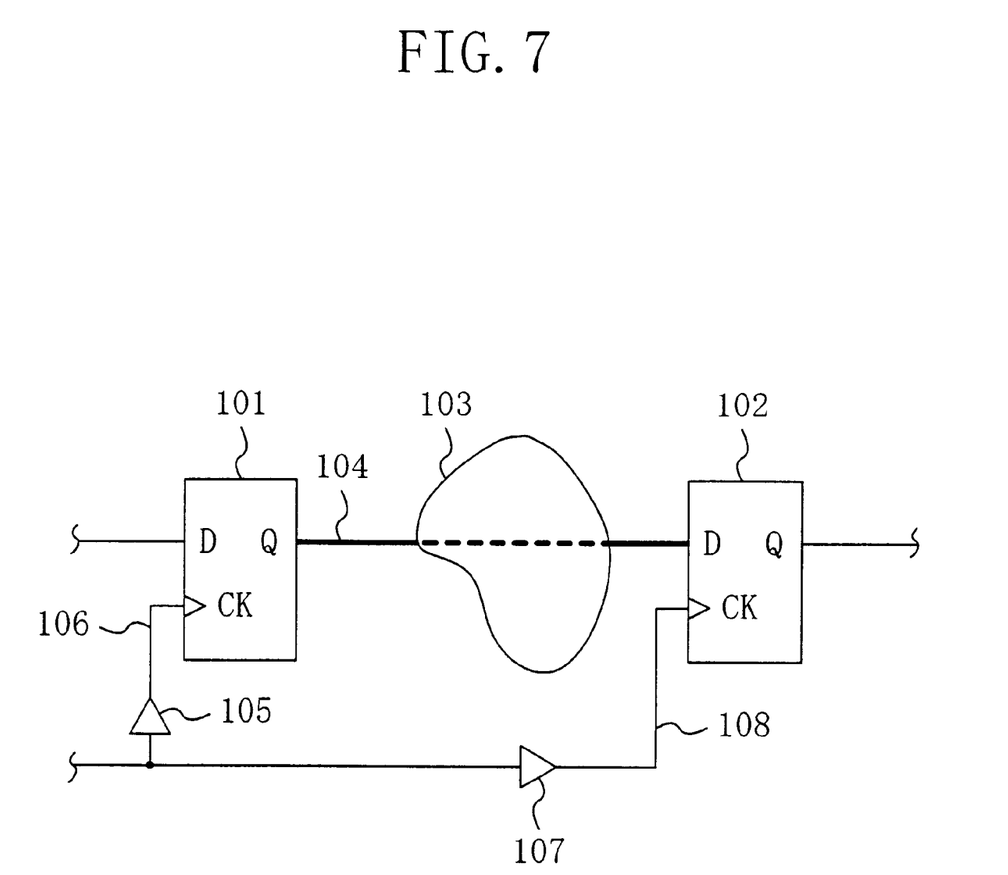
FIG. 7 is a diagrammatic partial circuit diagram of a semiconductor integrated circuit which is for illustrating a conventional path delay test.

FIG. 7 partially shows a semiconductor integrated circuit to be tested. As shown in FIG. 7, a combinational circuit 103 containing at least one combinational logic element is disposed between first and second flip-flops 101 and 102 each having a data input terminal D, a data output terminal Q, and a clock input terminal CK. One of a plurality of signal paths connecting the first and second-flip-flops 101 and 102 is designated at 104. The clock input terminal CK of the first flip-flop 101 is connected to a first clock line 106 via a first clock tree buffer 105. The clock input terminal CK of the second flip-flop 102 is connected to a second clock line 108 via a second clock tree buffer 107.

Figure 8A:
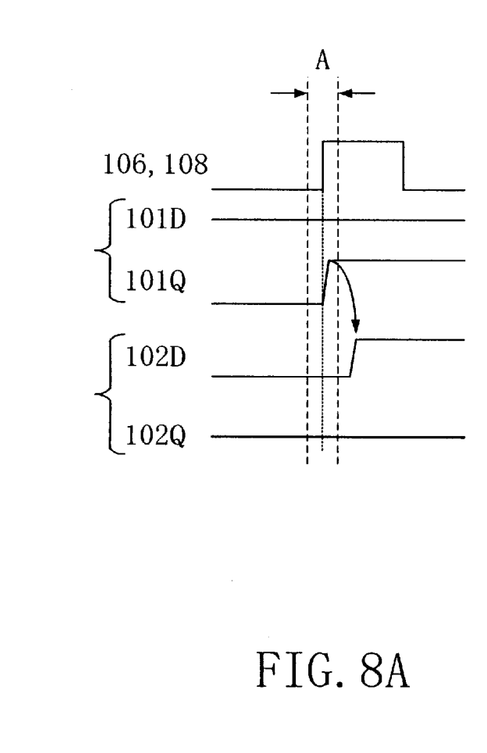
FIGS. 8A to 8C are signal waveform charts showing the operation of the semiconductor integrated circuit of FIG. 7.
Figure 8B:
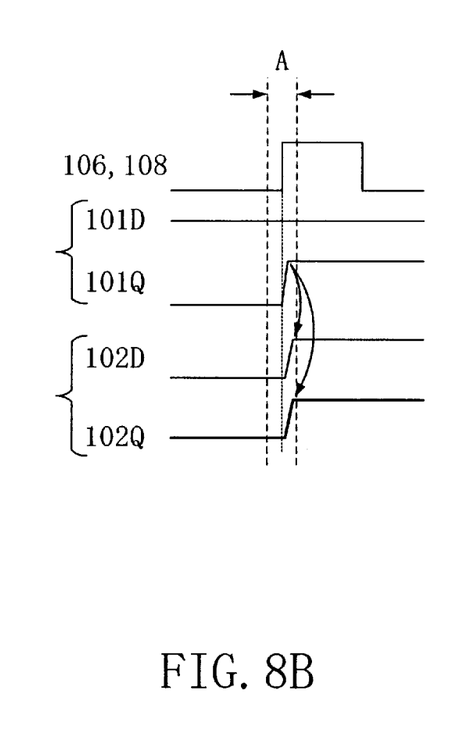
Figure 8C:
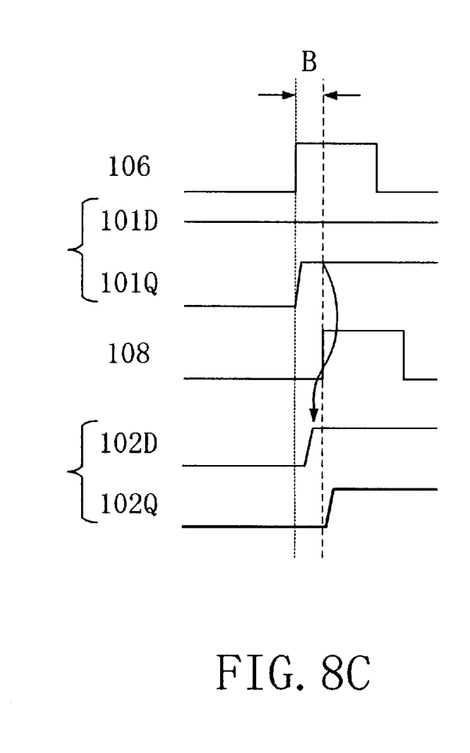

FIGS. 8A to 8C show signal waveforms illustrating the operation of the semiconductor integrated circuit of FIG. 7, of which FIG. 8A shows the case where the degree of delay on a signal path 104 is in a normal range, FIG. 8B shows the case where a fault is caused by an excessively reduced delay with which a signal propagates along the signal path 104 faster than a design value, and FIG. 8C shows the case where a skew resulting from variations in delay value occurs between the first and second clock lines 106 and 108.

As shown in FIG. 8A, a delay value on the signal path 104 is determined at the design stage to allow a hold margin A for the second flip-flip 102 even when the signal propagates at a highest expected speed. At this stage, the sizes, locations, and the like of the first and second clock tree buffers 106 and 107 are adjusted such that the amount of skew of a clock signal on each of the first and second clock lines 106 and 108 becomes zero or nearly zero.

However, if the signal on the signal path 104 propagates at a speed not higher than the delay value determined at the design stage due to the factor (1) resulting from variations or a defect in the process of manufacturing a semiconductor integrated circuit as shown in FIG. 8B, the second flip-flop 102 undergoes a hold error, which may cause the mis-operation of the second flip-flop 102.

Even when the delay value on the signal path 104 is normal, if the first clock tree buffer 105, the second clock tree buffer 107, the first clock line 106, or the second clock line 108 suffers a defect or variations during the manufacturing thereof and the clock signal on the clock line 106 or 108 develops a skew due to the factor (2) as shown in FIG. 8C, the second flip-flop 102 latches by mistake the signal after the transition from the first flip-flop 101 so that a mis-operation occurs.

If any of the signal paths undergoes a mis-operation due to a defect produced in the manufacturing process, it is necessary to conduct a test for detecting a fault on the signal path and generate a test pattern to be used in the test.

SUMMARY OF THE INVENTION

It is therefore an object of the present invention to allow the generation of a test pattern necessary for the testing of a scan-designed semiconductor integrated circuit for an excessively reduced delay and allow a test for the excessively reduced delay.

To attain the foregoing object, a first method of generating a test pattern for a semiconductor integrated circuit according to the present invention assumes a method of generating a test pattern for a semiconductor integrated circuit comprising a logic circuit containing a combinational logic element, a first sequential circuit having an output side connected to an input side of the logic circuit, and a second sequential circuit having an input side connected to an output side of the logic circuit, whereby a test pattern for testing a signal path between the first and second sequential circuits for a data retention error associated with data held by the second sequential circuit based on output data of the second sequential circuit is generated, the method comprising the steps of: generating a first test pattern by setting, at the first sequential circuit, a first set value for the signal path such that the signal path is activated immediately before and after one pulse of a clock signal for synchronization is inputted; and generating a second test pattern by setting, at the first sequential circuit, a second set value obtained by inverting the first set value.

In accordance with the first method of generating a test pattern for a semiconductor integrated circuit, the first test pattern is generated by setting, at the first sequential circuit, the first set value for the signal path such that the signal path is activated immediately before and after one pulse of the clock signal for synchronization is inputted and the second test pattern is generated by setting, at the first sequential circuit, the second set value obtained by inverting the first set value. This allows testing when a mis-operation results from a data retention error due to an excessively reduced delay on the signal path to be tested.

A second method of generating a test pattern for a semiconductor integrated circuit according to the present invention assumes a method of generating a test pattern for a semiconductor integrated circuit comprising first and second logic circuits each containing a combinational logic element, a first scan register having an input side connected to an output side of the first logic circuit and an output side connected to an input side of the first logic circuit, and a second scan register having an input side connected to an out put side of the second logic circuit, whereby a test pattern for testing a signal path between the first and second scan registers for a data retention error associated with data held by the second scan register based on output data of the second scan register is generated, the method comprising the steps of: setting, at the first scan register, a first set value as an output value thereof; generating a first test pattern by performing an implication operation with respect to the first or second logic circuit based on the first set value; setting, at the first scan register, a second set value obtained by inverting the first set value as an input value thereof; generating a second test pattern by performing an implication operation with respect to the first or second logic circuit based on the second set value; and generating a scan test pattern by combining the first and second test patterns such that the signal path is activated immediately before and after one pulse of a clock signal for synchronization is inputted.

In accordance with the second method of generating a test pattern for a semiconductor integrated circuit, the first test pattern is generated by performing the implication operation with respect to the first or second logic circuit connected to the first scan register based on the first set value set as the output value of the first scan register. Subsequently, the second test pattern is generated by performing the implication operation with respect to the first or second logic circuit based on the second set value set as the input value of the first scan register and obtained by inverting the first set value. Subsequently, one scan test. pattern is generated by combining the first and second test patterns, such that the signal path to be tested is activated immediately before and after one pulse of the clock signal for synchronization is inputted. If one pulse of the clock signal for synchronization is given not for a scan operation but for a normal operation, therefore, the logic of the signal suffers no contradiction before and after the one pulse. This allows testing when a mis-operation results from a data retention error due to an excessively reduced delay on the signal path to be tested.

A method of testing a semiconductor integrated circuit according to the present invention assumes a method of testing a semiconductor integrated circuit comprising a logic circuit containing a combinational logic element, a first scan register having an output side connected to an input side of the logic circuit, and a second scan register having an input side connected to an out put side of the first logic circuit, whereby a signal path between the first and second scan registers is tested for a mis-operation resulting from a data retention error associated with data held by the second scan register, the method comprising the steps of: preparing a test pattern to be inputted to the signal path; selecting a scan path containing the first and second scan registers; performing a scan-in operation with respect to the selected scan path to input the test pattern to the scan path; performing a capture operation with respect to the scan path by using one pulse of a clock signal for synchronization to input, to the scan path, a propagation signal propagating along the signal path and activated immediately before and after the one pulse; and performing a scan-out operation with respect to the scan path to output, from the second scan register, the propagation signal as a result of the testing.

In accordance with the method of testing the semiconductor integrated circuit of the present invention, the scan-in operation is performed with respect to the scan path to input, to the scan path, the test pattern according to the present invention that has been prepared in advance. Subsequently, the scan path is caused to perform not a scan operation but the capture operation, which is an actual operation, by using one pulse of the clock signal for synchronization so that the propagation signal propagating along the signal path activated immediately before and after the one pulse is inputted directly to the second scan register from the first scan register with no intervention of another scan register. This allows a test for the delay of the propagation signal actually propagating along the signal path to be tested and thereby allows testing when a mis-operation results from a data retention error due to an excessively reduced delay on the signal path to be tested. This is because an output signal of the first scan register is not necessarily inputted directly to the second scan register and may be outputted to another scan register since the scan path test is conducted by using a shift register composed only of a plurality of scan registers. Even when a frequency lower than the clock frequency for an actual operation is used, the real-time property of the testing method according to the present invention is not impaired.

DETAILED DESCRIPTION OF THE INVENTION

EMBODIMENT 1

Referring to the drawings, a first embodiment of the present invention will be described.

Figure 1:
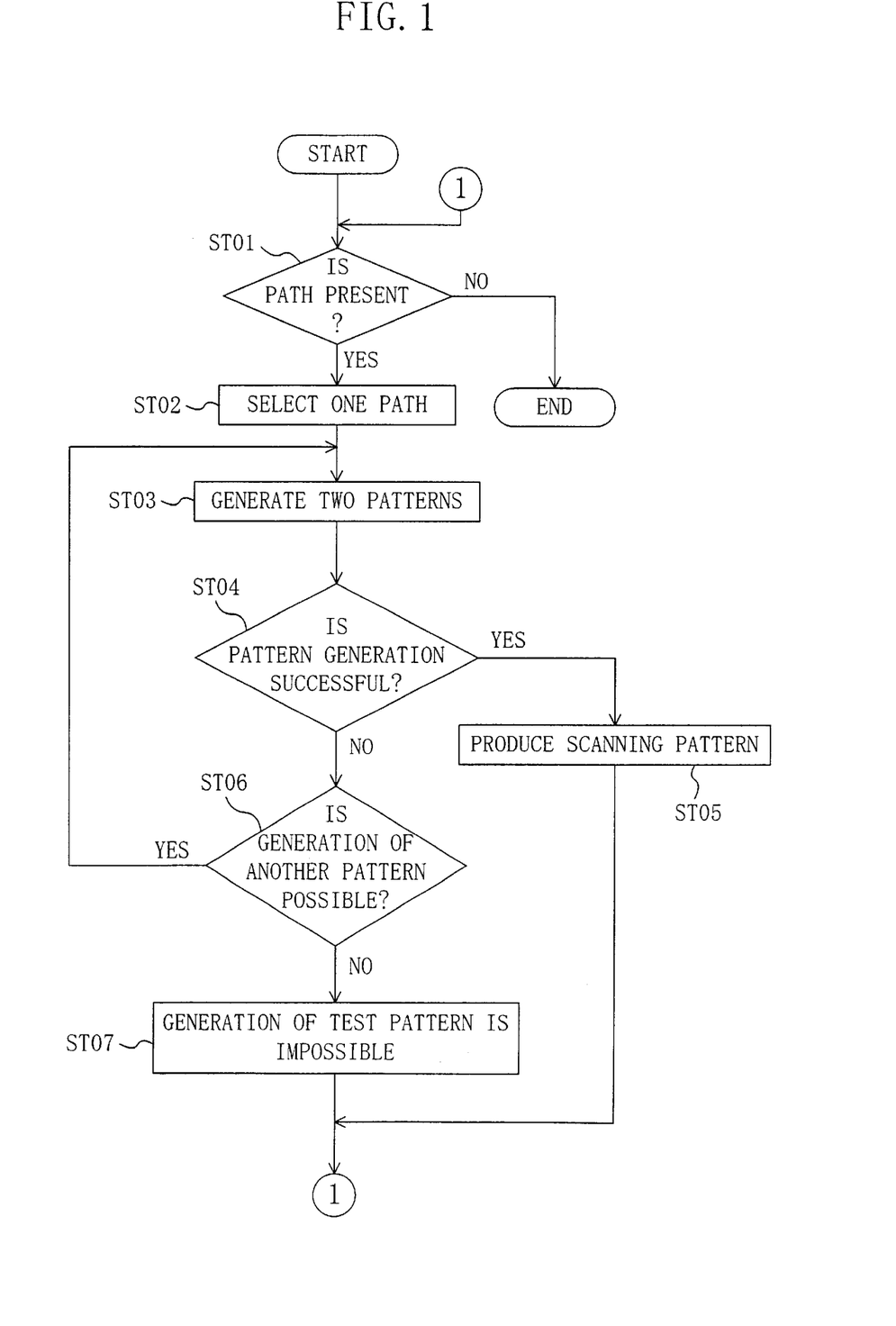
FIG. 1 is a schematic flow chart showing a method of generating a test pattern for a semiconductor integrated circuit according to a first embodiment of the present invention.

FIG. 1 shows a schematic flow of a method of generating a test pattern for a semiconductor integrated circuit according to the first embodiment of the present invention. As shown in FIG. 1, it is judged in the path judging step ST01 whether or not there is an unprocessed path to be tested among a plurality of signal paths (hereinafter referred to as paths) contained in a semiconductor integrated circuit.

Then, if there is an unprocessed path to be tested, it is selected in the path selecting step ST02.

Next, in the two-pattern-generation trying step ST03, the generation of an initializing pattern and a transition pattern which are necessary for the testing of the path to be tested is tried.

Next, in the pattern-generation judging step ST04, it is judged whether or not the generation of the initializing pattern and the transition pattern is successful and, if it is successful, the whole process advances to the subsequent scanning-pattern generating step ST05.

Next, if it is judged that the generation of another initializing pattern and another transition pattern is possible in the remaining-pattern judging step ST06, the two-pattern-generation trying step ST03 and the subsequent steps are repeated.

If the generation of another initializing pattern and another transition pattern is impossible, it is determined in the generation-impossibility determining step ST07 that the generation of the test patterns is impossible and the path judging step ST01 and the subsequent steps are repeated.

In the scanning-pattern generating step ST05, the generated initializing pattern and transition pattern are converted to a scanning pattern.

Figure 2:
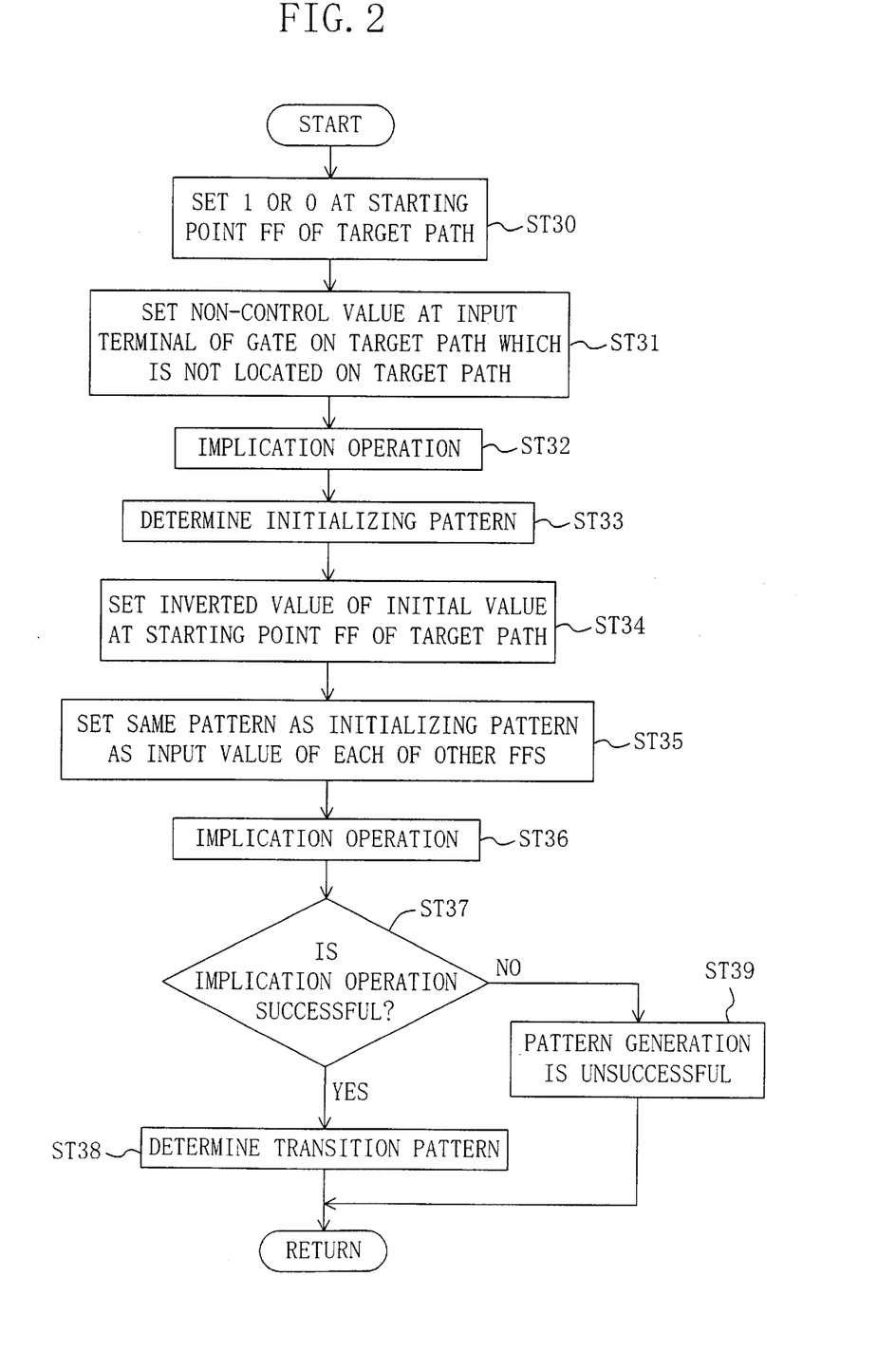
FIG. 2 is a detailed flow chart showing methods of generating an initializing pattern and a transition pattern in the method of generating a test pattern for a semiconductor integrated circuit according to the first embodiment of the present invention.

FIG. 2 shows a detailed flow of the two-pattern-generation trying step ST03 according to the present embodiment. As shown in FIG. 2, the initializing pattern is generated in the steps ST30 to ST33 and the transition pattern is generated in the steps ST34 to ST38 by changing an initial value of the path. Specifically, in the case of using a binary logic, the transition pattern is generated by causing the initial value to make a transition from 0 to 1 or a transition from 1 to 0.

First, in the step ST30, 0 or 1 is set as an output value of the flip-flop serving as a starting point of the path to be tested.

Next, in the step ST31, a non-control value which cannot change a logic value as an output result from each of logic elements (gates) located on the path to be tested and having a plurality of input terminals is set at the input terminal which is not located on the path to be tested.

Next, in the step ST32, an implication operation is performed with respect to the input side based on an input value of each of the gates set in the step ST31. The implication operation is defined herein as the operation of determining a logic value on the upstream side such that the logic value is not contradictory to the set value.

Next, in the step ST33, the initializing pattern as a first test pattern for a scan path composed of the flip-flop serving as the starting point and the flip-flop serving as an ending point is determined based on the results of the steps ST30 and ST32. At this stage, one or more other flip-flops may intervene the scan path between the starting and ending points thereof.

Next, in the step ST34, an inverted value of the value set in the step ST30 is set as an input value to the flip-flop serving as the starting point.

Next, in the step ST35, the initializing pattern is set for the scan path except for the flip-flop serving as the starting point.

Next, in the step ST36, an implication operation is performed with respect to the input side based on the value at an input terminal of each of the gates set in the steps ST34 and ST35.

Next, in the step ST37, it is judged whether or not the implication operation performed in the step ST36 is successful and, if it is successful, the transition pattern as a second test pattern is determined in the subsequent step ST38. If it is unsuccessful, it is determined in the subsequent step ST39 that the generation of the test pattern is impossible.

Figure 3:
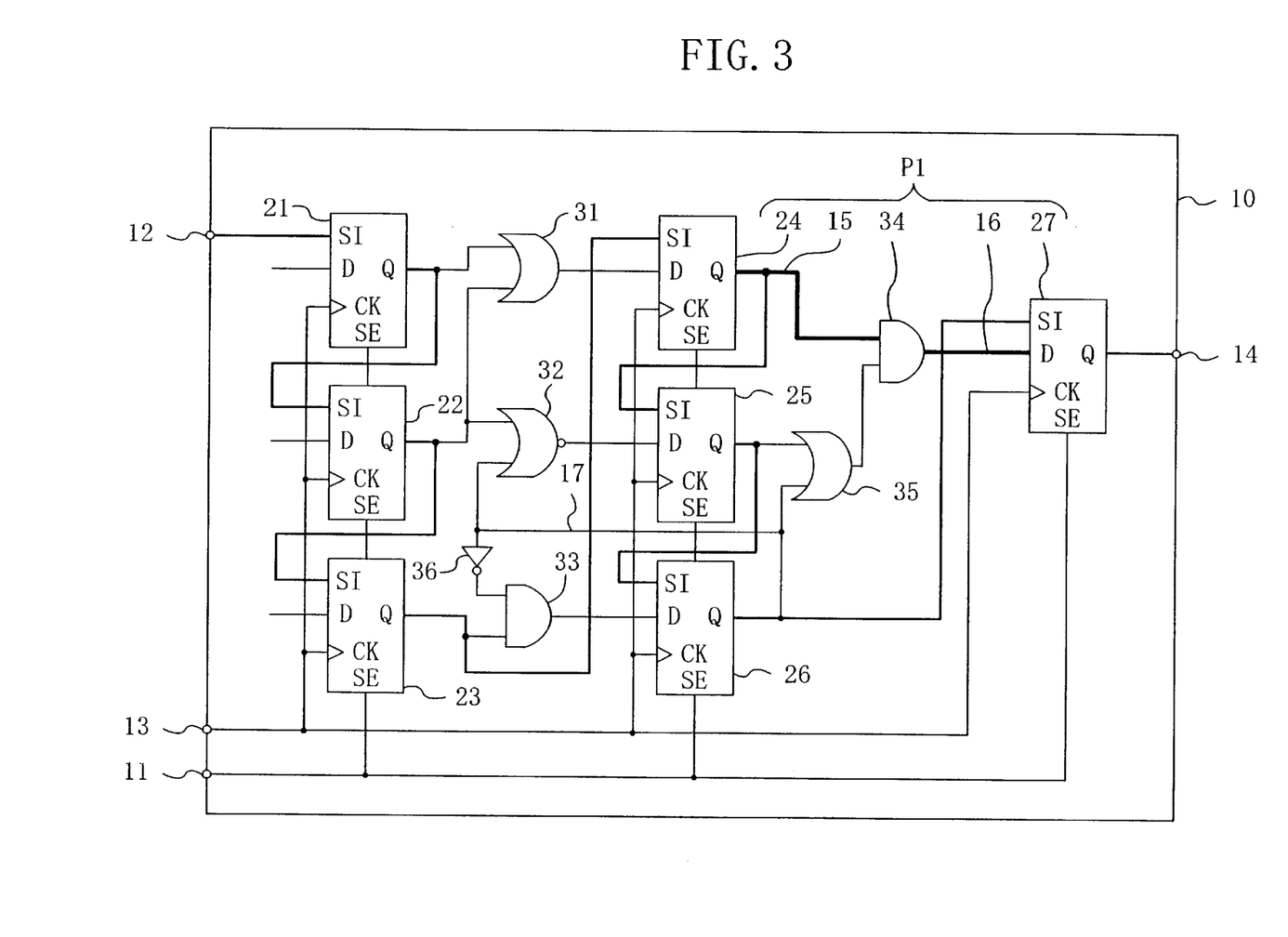
FIG. 3 is a circuit diagram of a semiconductor integrated circuit device to be tested in accordance with a testing method by using the method of generating a test pattern for a semiconductor integrated circuit according to the first embodiment of the present invention.

FIG. 3 shows a semiconductor integrated circuit device to be tested in accordance with a testing method by using the method of generating a test pattern for a semiconductor integrated circuit according to the present embodiment. As shown in FIG. 3, the semiconductor integrated circuit device 10 comprises: a scan enable signal input terminal 11 for receiving a scan enable signal SE which brings from the outside the semiconductor integrated circuit device 10 into a scan test state; a scan-in signal input terminal 12 for receiving a test pattern for a scan test; a clock signal input terminal 13 for receiving a clock signal CK for synchronizing the semiconductor integrated circuit device; and a scan-out signal output terminal 14 which also serves as an output terminal during normal operation.

The semiconductor integrated circuit device 10 has, e.g., seven scan flip-flops 21 to 27 which latch data based on the clock signal CK for synchronization during normal operation, while composing a shift register as a sequential circuit to form the scan path during a scan test. Each of the scan flip-flops 21 to 27 has an SI terminal for receiving a scan-in signal SI, a D terminal for receiving data during normal operation, a CK terminal for receiving the clock signal CK for synchronization, an SE terminal for receiving the scan enable signal SE, and a Q terminal for outputting data.

Figure 4:
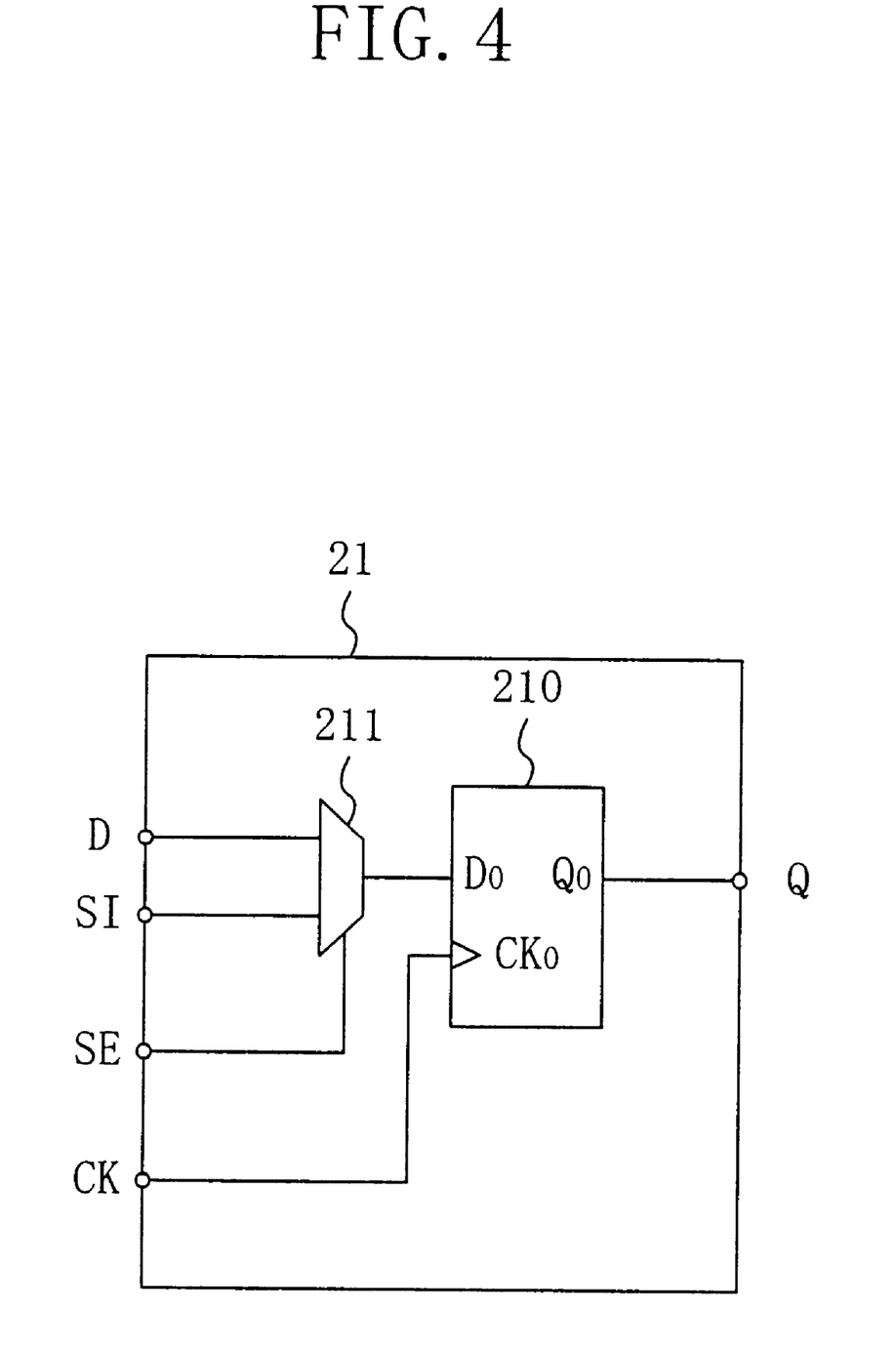
FIG. 4 is a circuit diagram showing a scan flip-flop in the semiconductor integrated circuit device shown in FIG. 3.

FIG. 4 shows an example of a detailed configuration of one of the scan flip-flops. In FIG. 4, the description of the same components as shown in FIG. 3 is omitted by retaining the same reference numerals. As shown in FIG. 4, the scan-flip-flop 21 is composed of a flip-flop 210 having a $D_0$ terminal, a $CK_0$ terminal, and a $Q_0$ terminal and a selector 211 for selecting between input data D to the scan flip-flop 21 and the scan-in signal SI in response to the scan enable signal SE and outputs the selected one to the $D_0$ terminal of the flip-flop 210. The flip-flop 210 latches data given to the $D_0$ terminal in synchronization with the clock signal CK for synchronization inputted to the $CK_0$ terminal and outputs the data from the $Q_0$ terminal. The selector 211 selects and outputs the signal at the D terminal when the signal at the SE terminal is 0 (in a normal operation mode) and selects and outputs the signal at the SI terminal when the signal at the SE terminal is 1 (in a scan operation mode). Each of the other scan flip-flops 22 to 27 has the circuit configuration shown in FIG. 4.

The first scan flip-flop 21 has the SI terminal connected to the scan-in signal input terminal 12, the CK terminal connected to the clock signal input terminal 13, and the SE terminal connected to the scan enable signal input terminal 11. The second scan flip-flop 22 has the SI terminal connected to the Q terminal of the first scan flip-flip 21. Likewise, the third scan flip-flop 23 is connected such that output data therefrom is inputted successively to the fourth, fifth, sixth, and seventh scan flip-flops 24 to 27. The scan enable signal SE and the clock signal CK for synchronization are inputted in parallel to each of the second to seventh scan flip-flops 22 to 27.

A first OR gate 31 which is a combinational logic element is disposed between the first and fourth scan flip-flops 21 and 24. A NOR gate 32 which is a combinational logic element is disposed between the second and fifth scan flip-flops 22 and 25. A first AND gate 33 which is a combinational logic element is disposed between the third and sixth scan flip-flops 23 and 26. A second AND gate 34 is disposed between the fourth and seventh scan flip-flops 24 and 27. A second OR gate 35 is disposed between the fifth and seventh scan flip-flops 25 and 27.

The first OR gate 31 has one input terminal connected to the Q terminal of the first scan flip-flop 21, the other input terminal connected to the Q terminal of the second scan flip-flop 22, and an output terminal connected to the D terminal of the fourth scan flip-flop 24.

The NOR gate 32 has one input terminal connected to the Q terminal of the second scan flip-flop 22, the other input terminal connected to an input terminal of the second OR gate 35 and to the input terminal of an inverter 36, and an output terminal connected to the D terminal of the fifth scan flip-flop 25.

The first AND gate 33 has one input terminal receiving an output of the inverter 36, the other input terminal connected to the Q terminal of the third scan flip-flop 23, and an output terminal connected to the D terminal of the sixth scan flip-flop 26.

The second AND gate 34 has one input terminal connected to the Q terminal of the fourth scan flip-flop 24 via a first line 15, the other input terminal connected to the output terminal of the second OR gate 35, and an output terminal connected to the D terminal of the seventh scan flip-flop 27 via a second line 16.

The second OR gate 35 has one input terminal connected to the Q terminal of the fifth scan flip-flop 25 and the other input terminal connected to the input terminal of the inverter 36 via a third line 17.

The method of generating a test pattern according to the present embodiment will be described based on the semiconductor integrated circuit device 10 thus constituted.

Of a plurality of paths contained in the semiconductor integrated circuit device 10, the path composed of the fourth scan flip-flop 24, the first line 15, the second AND gate 34, the second line 16, and the seventh scan flip-flop 27 is designated as a path P1 to be tested.

First, an untested one of the plurality of paths is searched for in the path judging step ST01 shown in FIG. 1. It is assumed in the subsequent path selecting step ST02 that the untested path P1 is selected. Subsequently, the generation of the initializing pattern and the transition pattern is tried in the two-pattern-generation trying step ST03. The trying process will be described in accordance with the detailed flow shown in FIG. 2.

As shown in FIG. 2, the initializing pattern is determined first. Specifically, 0 is set as an output value of the fourth scan flip-flop 24 serving as the starting point of the path P1 in the step ST30.

Next, since the 2-input second AND gate 34 is located on the path P1, a non-control value of 1 which cannot change a logic value as an output result from the second AND gate 34 is set at the input terminal of the second AND gate 34 which is not located on the path P1 in the step ST31.

Next, in the step ST32, the implication operation is performed with respect to the input side based on the input and output values of the second AND gate 34 set in the step ST31. As a result of the implication operation, the output value of the second OR gate 35 is determined to be 1 with the non-control value of 1 set at the second AND gate 34, while the two input values of the second OR gate 35 are not determined. This is because the two input values of the second OR gate 35 may assume three combinations of (1, 1), (1, 0), and (0, 1).

Next, it is assumed in the step ST33 that (1, 1) is adopted from the three combinations and set at the fifth and sixth scan flip-flops 25 and 26. As a result, the output values of the fourth to sixth flip-flops 24 to 26 are determined to be (0, 1, 1) in the initializing pattern.

Next, the generation of the transition pattern is tried. In the step ST34, 1 obtained by inverting the value set in the step ST30 is set as an input value of the fourth scan flip-flop 24 as the starting point of the path P1.

Next, in the step ST35, (1, 1) partially forming the initializing pattern are set at the fifth and sixth scan flip-flops 25 and 26 which are among the fourth to sixth scan flip-flops 24 to 26 having the output values set in the step ST33 exclusive of the fourth scan flip-flop 24 serving as the starting point of the path P1.

Next, in the step ST36, the implication operation is performed with respect to the input side based on the values set in the steps ST34 and ST35. As stated previously, the two input values of the 2-input first OR gate 31 cannot be determined at this stage since an output value thereof is 1. on the other hand, each of the two input values of the NOR gate 32 can be determined to be 0 by the implication operation since an output value of the NOR gate 32 is 1. However, since the input terminal of the NOR gate 32 connected to the input terminal of the inverter 36 is connected to the Q terminal of the sixth scan flip-flop 26 via the third line 17 and the output value of the sixth scan flip-flop 26 is determined to be 1 in the step ST33, a contradiction occurs. Accordingly, it is judged in the subsequent step ST37 that the implication operation is unsuccessful and the generation of the two patterns is determined to be unsuccessful in the subsequent step ST39.

Consequently, the pattern generation is judged to be unsuccessful in the pattern generation judging step ST04 shown in FIG. 1. In the subsequent remaining pattern judging step ST06, it is judged whether or not another initializing pattern is present. Here, the two-pattern-generation trying step ST03 and the subsequent steps are repeated since each of (1, 0) and (0, 1) has not been tried as the pattern for the fifth and sixth scan flip-flops 25 and 26 in the step ST33.

The description of the process performed in the steps ST30 to ST32 of the second two-pattern-generation trying step ST03 will be omitted since it is the same as the content of the process described above.

Next, in the step ST33, (1, 0) is adopted as the initializing pattern for the fifth and sixth scan flip-flops 25 and 26 from among the remaining patterns.

Next, in the step ST34, 1 obtained by inverting the value set in the step ST30 is set as an input value of the fourth scan flip-flop 24 serving as the starting point of the path P1.

Next, in the step ST35, the values (1, 0) determined in the step ST33 are set at the fifth and sixth scan flip-flops 25 and 26 exclusive of the fourth scan flip-flop 24. Specifically, the value of 1 is set at the fifth scan flip-flop 25 and the value of 0 is set at the sixth scan flip-flop 26.

Next, in the step ST36, the implication operation is performed with respect to the input side based on the values set in the steps ST34 and ST35. The two input values of the 2-input first OR gate 31 cannot be determined since the output value thereof is 1. On the other hand, each of the two input values of the NOR gate 32 can be determined to be 0 by the implication operation since the output value of the NOR gate 32 is 1. Since the output value of the sixth scan flip-flop 26 connected to the third line 17 is also 0, no contradiction occurs. Although the output value of the first AND gate 33 is 0, the value 0 on the third line 17 is inverted by the inverter 36 to become 1 so that the value at the other input terminal of he first AND gate 33 is determined to be 0 by the implication operation. Since each of the two input values of the NOR gate 32 is determined again to be 0 in the first OR gate 31, the input value of the first OR gate 31 from the first scan flip-flop 21 can be determined to be 1 since the input value of the fourth scan flip-flop 24 is 1. This renders each implication operation successful with no contradiction, so that the implication operation is judged to be successful in the step ST37 shown in FIG. 2 and (1, 0, 0, 0) is determined as the transition pattern for the first, second, third, and sixth scan flip-flops 21, 22, 23, and 26 in the subsequent step ST38.

Then, it is judged in the pattern-generation judging step ST04 shown in FIG. 1 that the generation of the two patterns is successful so that the initializing pattern and the transition pattern are converted to the scanning-pattern in the subsequent scanning-pattern generating step ST05. Here, the initializing pattern (X, X, X, 0, 1, 0) for the fourth to sixth scan flip-flops 24 to 26 resulting from the step ST33 shown in FIG. 2 and the transition pattern (1, 0, 0, X, X, 0) for the first to third scan flip-flops 21 to 23 and the sixth scan flip-flop 26 are converted to one scanning pattern. Here, X represents an infinite value. If the scan flip-flops and the determined values are associated successively with each other, it can be understood from the results that the values to be set at the first to sixth scan flip-flops 21 to 26 become (1, 0, 0, 0, 1, 0). Consequently, the scanning pattern given from the scan-in signal input terminal 12 of the semiconductor integrated circuit device 10 is converted to 0→1→0→0→0→1. Since the scanning pattern is composed of serial data, it becomes "100010" if represented as a bit string, which is inputted sequentially from the MSB (most significant bit) side.

Next, the path judging step ST01 shown in FIG. 1 and the subsequent steps are repeated and the process is completed if there is no untested path.

In this manner, the test pattern for the path P1 in the semiconductor integrated circuit 10 can be generated.

EMBODIMENT 2

Referring to the drawings, a second embodiment of the present invention will be described.

Figure 5:
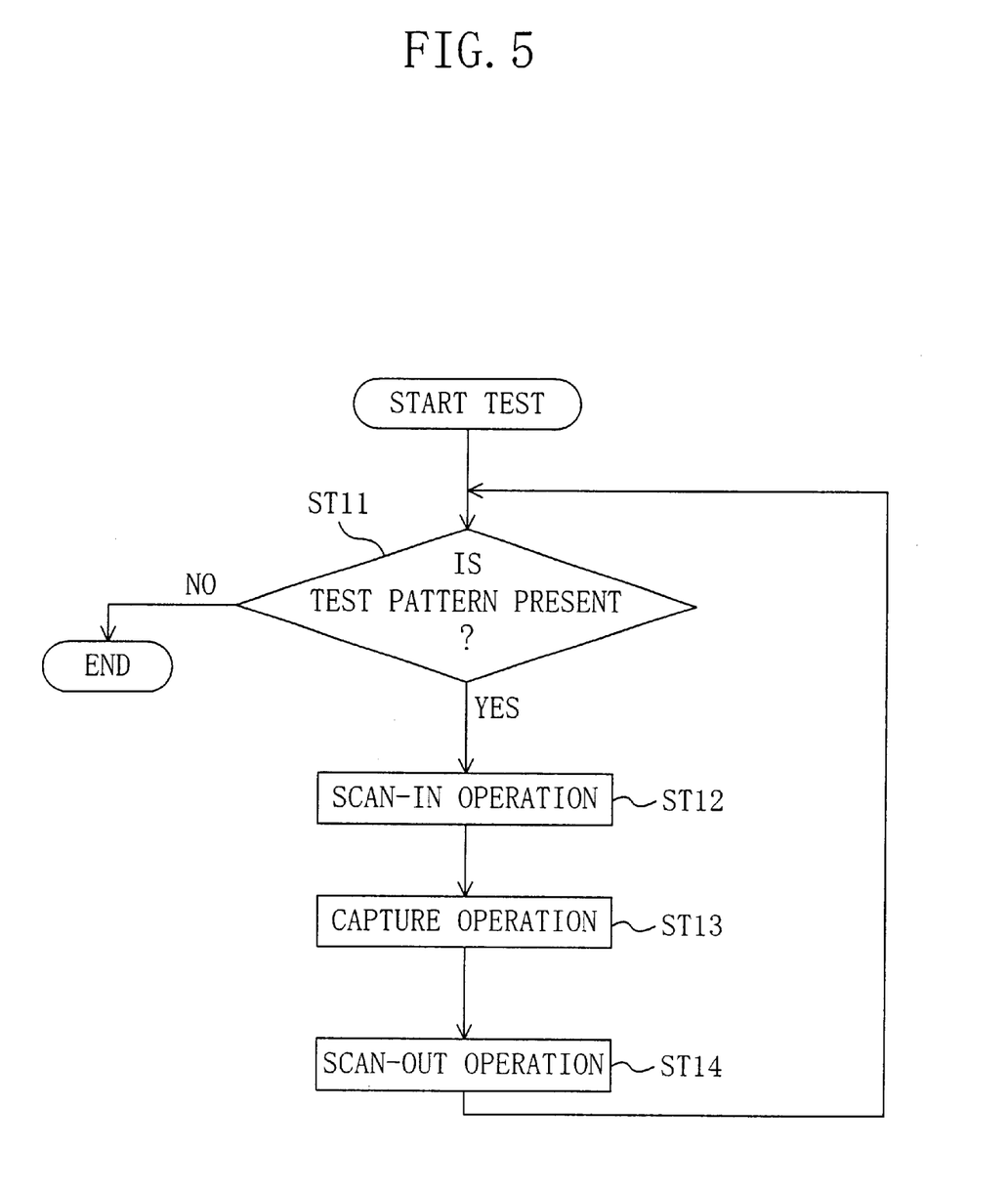
FIG. 5 is a flow chart showing a method of testing a semiconductor integrated circuit according to a second embodiment of the present invention.

FIG. 5 shows a schematic flow of a method of testing a semiconductor integrated circuit according to the second embodiment of the present invention. In the present embodiment, the description will be given to a method of testing a delay on the path P1 in the semiconductor integrated circuit device 10 shown in FIG. 3. It is assumed herein that a design delay time on the path P1 in the semiconductor integrated circuit 10 is 1 ns, a hold margin for each of the first to seventh scan flip-flops 21 to 27 is 0.5 ns, and a skew time of the clock signal CK for synchronization supplied to each of the scan flip-flops 21 to 27 is 0 ns.

First, as shown in FIG. 5, it is assumed in the path judging step ST11 that an untested path of a plurality of paths is searched for and the path P1 is judged to be the untested path.

Figure 6:
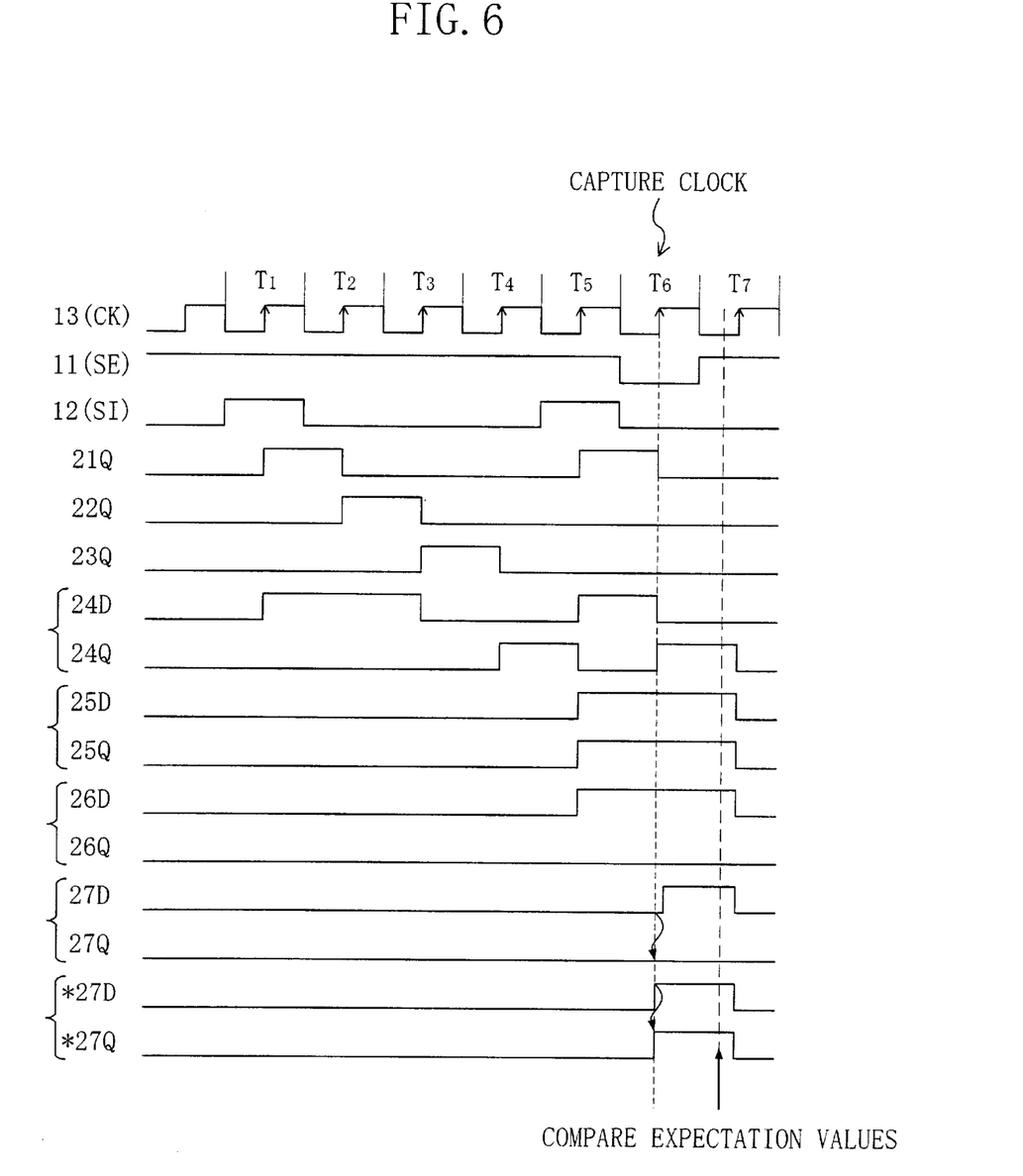
FIG. 6 is a timing chart in the method of testing a semiconductor integrated circuit according to the second embodiment of the present invention.

Next, in the scan-in operation step ST12, the scanning pattern (0→1→0→0→0→1) generated for the path P1 is inputted in five clocks (T1 to T5) from the scan-in signal input terminal 12 to the semiconductor integrated circuit device 10, as shown in the timing chart of FIG. 6. FIG. 6 shows the respective signal waveforms of a control signal and input/output signals of each of the scan flip-flops 21 to 27, in which reference numerals 21Q to 27Q denote the respective Q terminals of the scan flip-flops 21 to 27, 24D to 27D denote the respective D terminals of the scan flip-flops 24 to 27, and *27D and *27Q denote the respective waveforms at the D and Q terminals of the seventh scan flip-flop 27 when the path P1 undergoes a mis-operation resulting from an excessively reduced delay.

As shown in FIG. 6, the values at the respective Q terminals of the first to sixth scan flip-flops 21 to 26 after the scanning pattern corresponding to the five clocks become 1, 0, 0, 0, 1, and 0. At this time, the logic value of the path P1 becomes 0 and the scan enable signal SE applied to the scan enable signal input terminal 11 becomes active during the period of the times T1 to T5.

Next, in the capture operation step ST13 shown in FIG. 5, the scan enable signal SE is inactivated at the time T6. As a result, the values inputted to the respective D terminals of the scan flip-flops 21 to 27 are outputted to the respective Q terminals thereof with the timing T6 with which the rearmost data 0 of the scanning pattern (0→1→0→0→0→1) is inputted. For example, 1 which is the output value of the D terminal (24D) of the fourth scan flip-flop 24, not 0 which is the output value of the third scan flip-flop 23, is outputted to the Q terminal (24Q) of the fourth scan flip-flop 24. As a result, the logic value of the path P1 changes to 1.

If the path P1 has not suffered an excessively reduced delay fault, as shown in FIG. 6, the value at the D terminal (27D) of the seventh scan flip-flop 27 changes from 0 to 1 after a capture clock T6 has been inputted and then a time of about 1 ns, which is a given delay time, has elapsed. In this case, since there is a sufficient margin for the hold margin of 0.5 ns for the seventh scan flip-flop 27, the seventh scan flip-flop 27 normally operates and the value at the Q terminal (27Q) after the capture clock T6 has been inputted becomes 0.

Next, in the scan-out operation step ST14 shown in FIG. 5, a scan-out operation is performed. Specifically, the scan enable signal SE is activated again at the time T7 and the result of testing is monitored at the scan-out signal output terminal 14 of the semiconductor integrated circuit device 10. Since the Q terminal (27Q) of the seventh scan flip-flop 27 is connected directly to the scan-out signal output terminal 14, the value at the Q terminal of the seventh scan flip-flop 27 is compared with an expectation value with a timing after the capture clock T6 and before the inputting of the subsequent clock T7. At this time, if an output value 0 is observed at the scan-out signal output terminal 14, the normality of the path P1 to be tested is guaranteed.

If the path P1 has suffered a fault resulting from an excessively reduced delay and the delay time on the path P1 becomes 0.2 ns, the value at the D terminal (27D) of the seventh scan flip-flop 27 changes from 0 to 1 after 0.2 ns has elapsed from the inputting of the capture clock T6. Accordingly, the margin for the hold margin of 0.5 ns for the seventh scan flip-flop 27 is insufficient and there is the possibility that the seventh scan flip-flop 27 undergoes a mis-operation when the capture clock T6 is inputted.

If the seventh scan flip-flop 27 undergoes a mis-operation when the capture clock T6 is inputted as shown in FIG. 6, the seventh scan flip-flop 27 latches 1 to which the value at the D terminal (*27D) has changed. Accordingly, the value at the Q terminal (*27) of the seventh flip-flop 27 becomes 1, which is different from the expectation value of 0, so that it is recognized that the circuit has trouble.

Next, the path judging step ST11 shown in FIG. 5 and the subsequent steps are repeated and, if there is no more untested path, the test is completed.

It is to be noted that the frequency of the clock is irrelevant to the excitation of a hold error (data retention error) by the activation of the path to be tested in the present embodiment. Therefore, the capture pattern used to activate the path to be tested does not require a clock signal at a high frequency. Even a clock signal at a relatively low frequency enables satisfactory testing.

What is claimed is:

1. A method of generating a test pattern for a semiconductor integrated circuit comprising a logic circuit containing a combinational logic element, a first sequential circuit having an output side connected to an input side of the logic circuit, and a second sequential circuit having an input side connected to an output side of the logic circuit, whereby a test pattern for testing a signal path between the first and second sequential circuits for a data retention error associated with data held by the second sequential circuit based on output data of the second sequential circuit is generated, the method comprising the steps of:

generating a first test pattern by setting, at the first sequential circuit, a first set value for the signal path such that the signal path is activated immediately before and after one pulse of a clock signal for synchronization during normal operation; and generating a second test pattern by setting, at the first sequential circuit, a second set value obtained by inverting the first set value.

2. A method of generating a test pattern for a semiconductor integrated circuit comprising first and second logic circuits each containing a combinational logic element, a first scan register having an input side connected to an output side of the first logic circuit and an output side connected to an input side of the second logic circuit, and a second scan register having an input side connected to an output side of the second logic circuit, whereby a test pattern for testing a signal path between the first and second scan registers for a data retention error associated with data held by the second scan register based on output data of the second scan register is generated, the method comprising the steps of:

setting, at the first scan register, a first set value as an output value thereof;

generating a first test pattern by performing an implication operation with respect to the first or second logic circuit based on the first set value;

setting, at the first scan register, a second set value obtained by inverting the first set value as an input value thereof;

generating a second test pattern by performing an implication operation with respect to the first or second logic circuit based on the second set value; and generating a scan test pattern by combining the first and second test patterns such that the signal path is activated immediately before and after one pulse of a clock signal for synchronization during normal operation.

3. A method of testing a semiconductor integrated circuit comprising a logic circuit containing a combinational logic element, a first scan register having an output side connected to an input side of the logic circuit, and a second scan register having an input side connected to an output side of the first logic circuit, whereby a signal path between the first and second scan registers is tested for a mis-operation resulting from a data retention error associated with data held by the second scan register, the method comprising the steps of:

preparing a test pattern to be inputted to the signal path;

selecting a scan path containing the first and second scan registers;

performing a scan-in operation with respect to the selected scan path to input the test pattern to the scan path;

performing a capture operation with respect to the scan path by using one pulse of a clock signal for synchronization during normal operation, to the scan path, a propagation signal propagating along the signal path and activated immediately before and after the one pulse; and performing a scan-out operation with respect to the scan path to output, from the second scan register, the propagation signal as a result of the testing.

* * * * *